United States Patent
Kojima

(10) Patent No.: US 8,993,354 B2
(45) Date of Patent: Mar. 31, 2015

(54) EVALUATION PATTERN, METHOD FOR MANUFACTURING SEMICONDUCTOR DEVICE, AND SEMICONDUCTOR WAFER

(71) Applicant: Kabushiki Kaisha Toshiba, Tokyo (JP)

(72) Inventor: Kenji Kojima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/841,087

(22) Filed: Mar. 15, 2013

(65) Prior Publication Data

US 2014/0077209 A1    Mar. 20, 2014

(30) Foreign Application Priority Data

Sep. 14, 2012    (JP) ................. 2012-202607

(51) Int. Cl.
*H01L 21/66* (2006.01)
*H01L 49/02* (2006.01)

(52) U.S. Cl.
CPC ............... *H01L 28/20* (2013.01); *H01L 22/14* (2013.01); *H01L 22/20* (2013.01); *H01L 22/34* (2013.01)
USPC .......................................... 438/17; 438/382

(58) Field of Classification Search
CPC ....... H01L 23/52; H01L 21/822; H01L 28/20; H01L 22/20; H01L 22/14; H01L 22/34; H01C 7/001; H01C 7/006; H01C 7/007
USPC ........................ 438/17, 382, 384, 385; 257/48
See application file for complete search history.

(56) References Cited

U.S. PATENT DOCUMENTS

| | | | |
|---|---|---|---|
| 5,893,990 A * | 4/1999 | Tanaka | .................. 219/121.8 |
| 6,836,002 B2 | 12/2004 | Chikawa et al. | |
| 6,852,627 B2 | 2/2005 | Sinha et al. | |
| 6,858,892 B2 | 2/2005 | Yamagata | |
| 6,875,921 B1 | 4/2005 | Conn | |
| 6,878,608 B2 | 4/2005 | Brofman et al. | |
| 6,905,953 B2 | 6/2005 | Lindgren | |
| 6,936,536 B2 | 8/2005 | Sinha | |
| 6,943,108 B2 | 9/2005 | Farooq et al. | |
| 6,960,837 B2 | 11/2005 | Iadanza | |
| 6,979,644 B2 | 12/2005 | Omote et al. | |
| 6,982,225 B2 | 1/2006 | Bohr | |
| 7,042,077 B2 | 5/2006 | Walk et al. | |

(Continued)

FOREIGN PATENT DOCUMENTS

JP    2000-021945 A    1/2000
JP    2006-040917 A    2/2006

(Continued)

*Primary Examiner* — Benjamin Sandvik
*Assistant Examiner* — Farid Khan
(74) *Attorney, Agent, or Firm* — Holtz, Holtz, Goodman & Chick PC

(57) ABSTRACT

According to one embodiment, a method for manufacturing a semiconductor device is disclosed. The method includes heating a resistor pattern by scanning the resistor pattern with a first beam. The resistor pattern includes resistors, and a connection structure connecting the resistors in series. The resistors is arranged in matrix of two or more rows and two or more columns. The method includes further heating the resistor pattern by scanning the resistor pattern with a second beam having a different scan direction as that of the first beam.

11 Claims, 12 Drawing Sheets

(56) References Cited

U.S. PATENT DOCUMENTS

| | | |
|---|---|---|
| 7,045,886 B2 | 5/2006 | Sawada |
| 7,064,005 B2 | 6/2006 | Takaoka |
| 7,078,264 B2 | 7/2006 | Yang |
| 7,098,528 B2 | 8/2006 | Vasishta et al. |
| 2006/0081842 A1* | 4/2006 | Tone et al. ............... 257/48 |
| 2008/0237724 A1* | 10/2008 | Nakata ................... 257/368 |
| 2011/0156149 A1* | 6/2011 | Wang et al. ............. 257/368 |

FOREIGN PATENT DOCUMENTS

| | | |
|---|---|---|
| JP | 2006-165222 A | 6/2006 |
| JP | 2009-064857 A | 3/2009 |

* cited by examiner

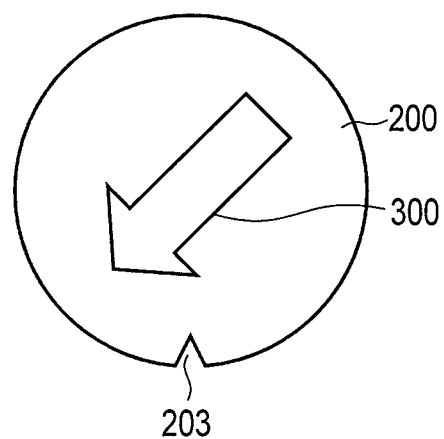
F I G. 12
|   | 1 | 2 | 3 | 4 | 5 | 6 | 7 | 8 |
|---|---|---|---|---|---|---|---|---|
| A | 1 |   |   |   | 1 |   |   | 1 |
| B |   |   |   |   |   |   |   |   |
| C |   |   |   |   |   |   |   |   |
| D | 1 |   |   |   | 2 |   |   |   |
| E |   |   |   | 2 |   |   |   | 1 |
| F |   |   |   |   |   |   |   |   |
| G |   |   |   |   |   |   |   |   |
| H | 1 |   |   |   |   | 1 |   | 1 |
F I G. 13

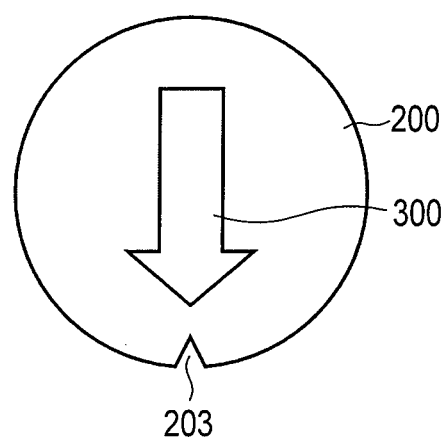
F I G. 14
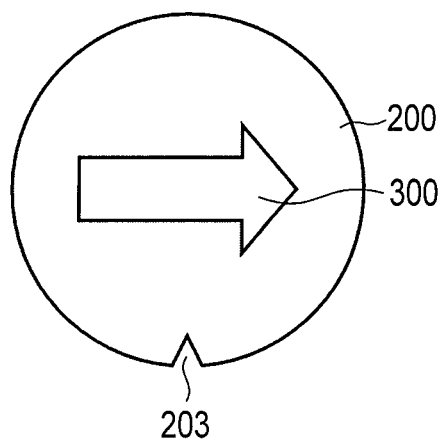
F I G. 15

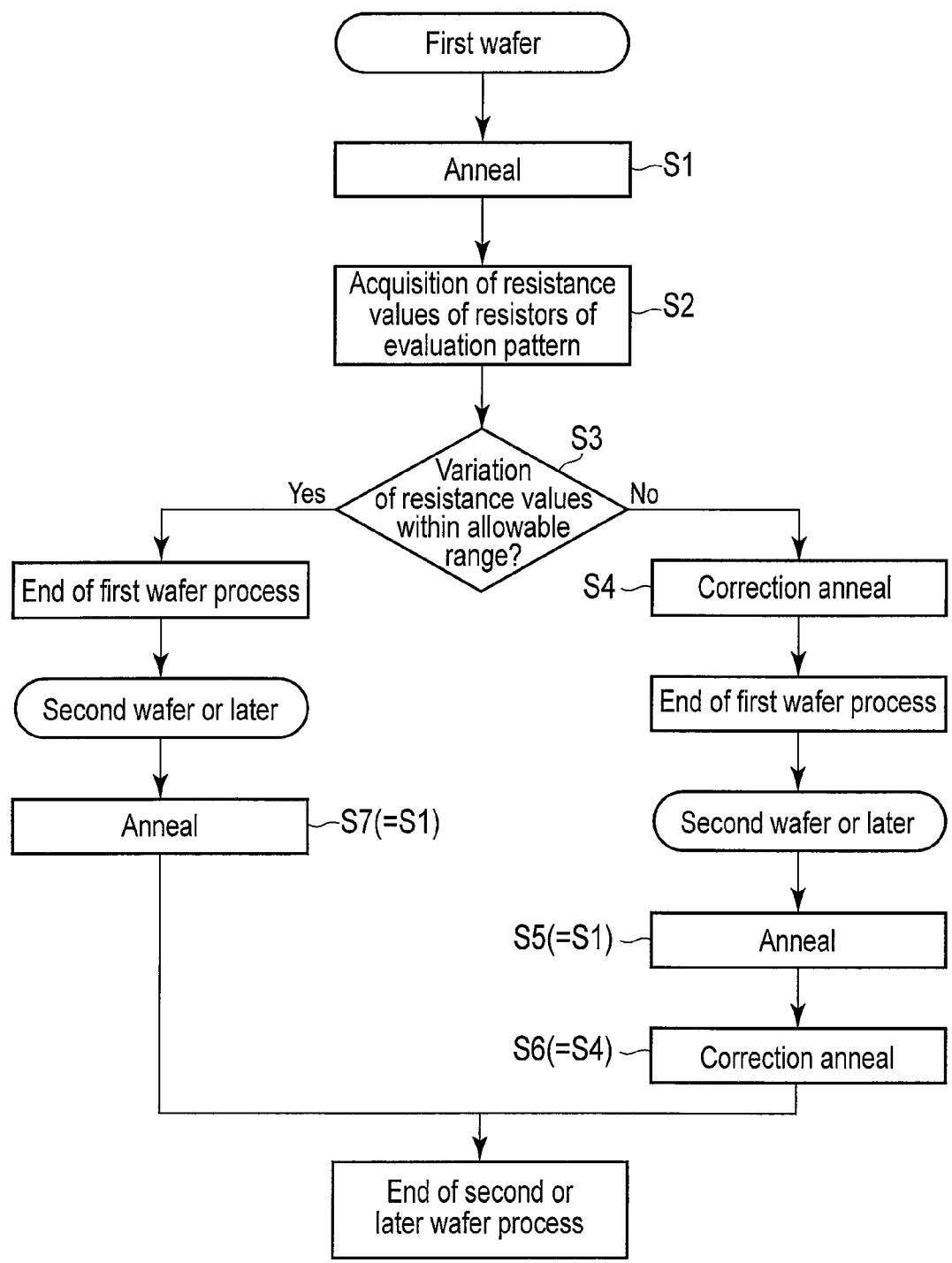
F I G. 18

EVALUATION PATTERN, METHOD FOR MANUFACTURING SEMICONDUCTOR DEVICE, AND SEMICONDUCTOR WAFER

CROSS-REFERENCE TO RELATED APPLICATIONS

This application is based upon and claims the benefit of priority from Japanese Patent Application No. 2012-202607, filed Sep. 14, 2012, the entire contents of which are incorporated herein by reference.

FIELD

Embodiments described herein relate generally to an evaluation pattern used in semiconductor field, a method for manufacturing a semiconductor device, and the semiconductor wafer.

BACKGROUND

Millisecond anneal is used for immediately supplying energy necessary for annealing, in a manufacturing method for a semiconductor device (CMOS device) including a CMOS (Complementary Metal Oxide Semiconductor) having 40 nm rule or later.

Laser Spike Anneal (LSA) is known as a technique of the millisecond anneal. In the LSA, a $CO_2$ (carbonic acid gas) laser device is used. The entire surface of a wafer is heated by scanning the surface of the wafer with laser beam.

However, the CMOS devices which have been obtained through the LSA may have a characteristic variation. Specifically, a plurality of resistors (impurity doped polycrystalline silicon) used in the CMOS device have a resistance variation.

BRIEF DESCRIPTION OF THE DRAWINGS

FIG. 12 is a diagram schematically illustrating a state of heating a semiconductor wafer, by scanning the semiconductor wafer with laser beam from upper right to lower left;

FIG. 13 is a diagram illustrating resistance variation of the evaluation pattern provided in the heated semiconductor wafer of FIG. 12;

FIG. 14 is a diagram illustrating a scan direction of the laser beam, for decreasing the resistance variation of the evaluation pattern provided in the heated semiconductor wafer of FIG. 8;

FIG. 15 is a diagram illustrating a scan direction of laser beam, for decreasing resistance variation of the evaluation pattern provided in the heated semiconductor wafer of FIG. 10;

FIG. 18 is a flowchart illustrating a manufacturing method of the semiconductor device according to the second embodiment;

DETAILED DESCRIPTION

Embodiments will now be described with reference to the accompanying drawings.

In general, according to one embodiment, a method for manufacturing a semiconductor device is disclosed. The method includes heating a resistor pattern by scanning the resistor pattern with a first beam. The resistor pattern includes a plurality of resistors and a connection structure configured to connect the plurality of resistors in series. The plurality of resistors is provided in a semiconductor wafer and is arranged in matrix of two or more rows and two or more columns. The method includes further heating the resistor pattern by scanning the resistor pattern with a second beam having a different scan direction as that of the first beam.

According to one embodiment, a method for manufacturing a semiconductor device in a semiconductor wafer is disclosed. The semiconductor device includes a resistor pattern including a plurality of resistors provided in the semiconductor wafer and arranged in matrix of two or more rows and two or more columns, and a connection structure configured to connect the plurality of resistors in series wherein the plurality of resistors includes a plurality of first resistors provided in a chip of the semiconductor wafer and a plurality of second resistors provided in a dicing area of the semiconductor wafer. The method includes heating the resistor pattern by scanning the plurality of resistors with a first beam under a first condition, acquiring resistance values of the plurality of second resistors; and determining whether variation of the resistance values of the plurality of first resistors is within an allowable range, based on the acquired resistance values of the plurality of second resistors.

According to one embodiment, a semiconductor wafer is disclosed. The semiconductor wafer includes a semiconductor substrate; a circuit provided on the semiconductor substrate and configured to include a plurality of first resistors; and an evaluation pattern provided on the semiconductor substrate and used for evaluating variation of resistance values of the plurality of first resistors, the evaluation pattern comprising a plurality of second resistors arranged in matrix of two or more rows and two or more columns, and a connection structure for connecting the plurality of resistors in series.

First Embodiment

Figure 1:
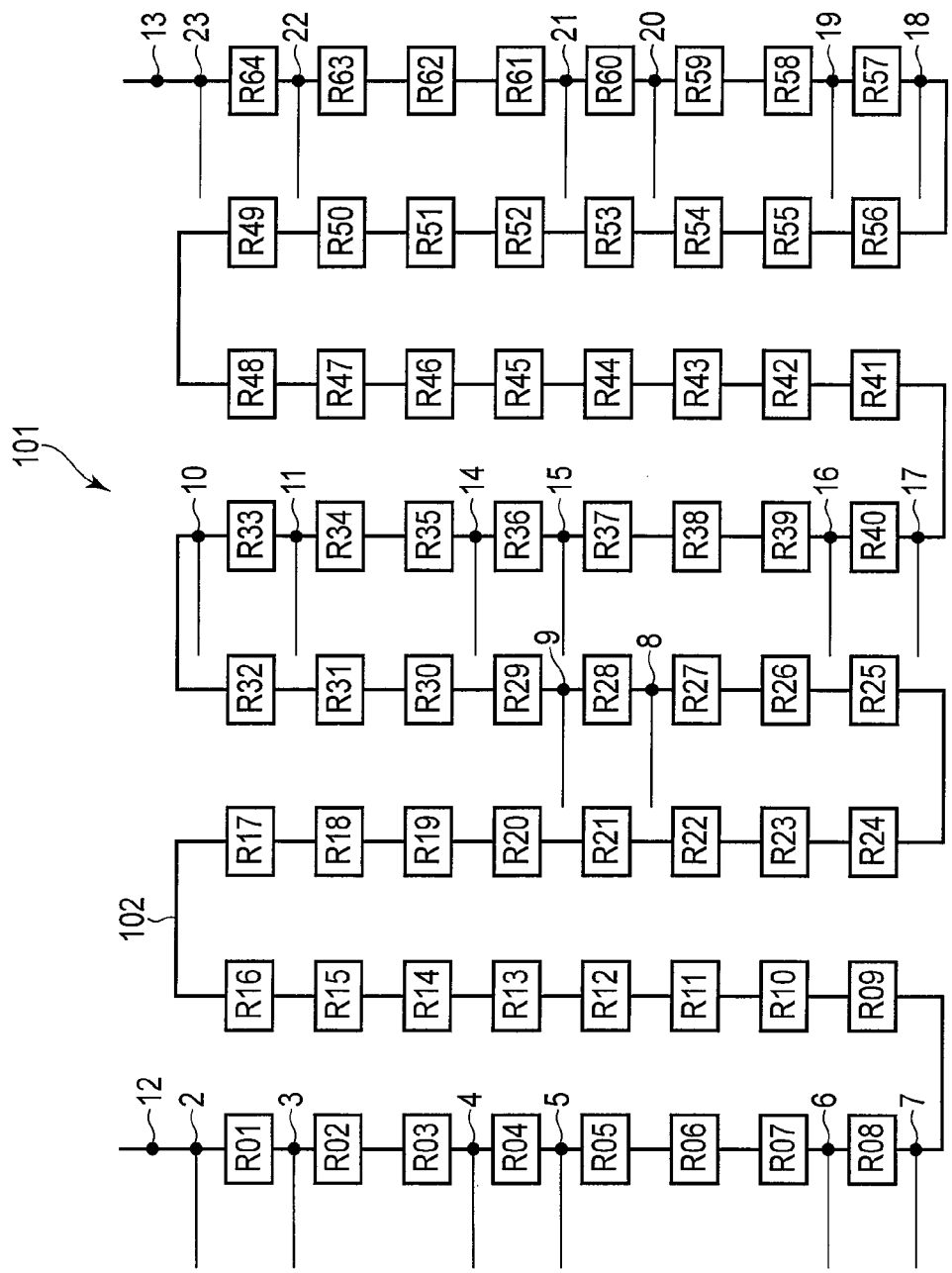
FIG. 1 is a plane view schematically illustrating an evaluation pattern according to a first embodiment.

FIG. 1 is a plane view schematically illustrating the evaluation pattern according to the first embodiment.

The evaluation pattern of the present embodiment is used for evaluating a resistance variation of a plurality of first resistors provided in a chip area of the semiconductor wafer, and includes a resistor pattern 101, as illustrated in FIG. 1.

The resistor pattern 101 includes a plurality of resistors, which include two or more rows and two or more columns and are arranged in matrix. FIG. 1 illustrates the resistor pattern 101 including sixty four resistors R01 to R64 arranged in matrix (eight rows by eight columns). The resistors R1 to R64 are connected in series by using current wiring 102 and contact plugs $103_1$ and $103_2$, as will be described later.

Figure 2:
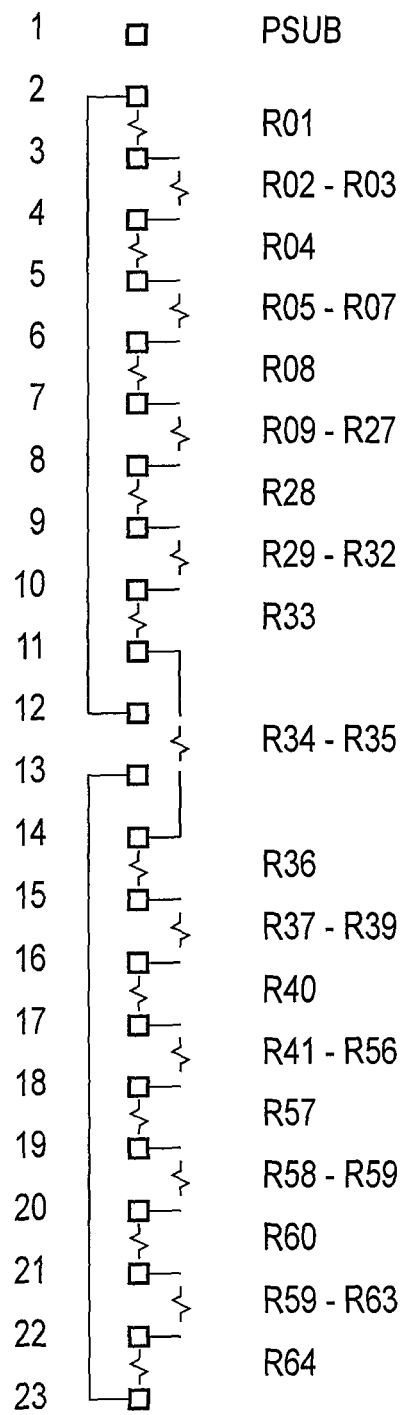
FIG. 2 is an equivalent circuit diagram of the evaluation pattern of FIG. 1.

In FIG. 1, reference numerals 2 to 23 indicate pad wiring for use in detecting voltage of the resistors to acquire the resistance value thereof. For example, in a state where a current I flows to current wiring 102, two probes of a known voltage detector are in contact with pad wiring 2 and 3 to detect a voltage V. As a result, the resistance value (V/I) of the resistor R01 can be acquired based on the current I and the voltage V. Similarly, it is possible to acquire also the resistance values of the resistance values of the resistors R04, R08, R28, R33, R36, R40, R57, R60, and R64. Further, the probes are in contact with pad wiring 5 and 6, thereby acquiring series resistance values of the resistors R5 to R7. FIG. 2 illustrates an equivalent circuit diagram of the evaluation pattern of FIG. 1. In FIG. 2, squares on the right hand side of the respective numerals 1, 2, . . . , 23 indicate the pad wiring 1, 2, . . . , 23 of FIG. 1. In addition, a symbol "PSUB" indicates a p well (ground) in the wafer.

Figure 3:
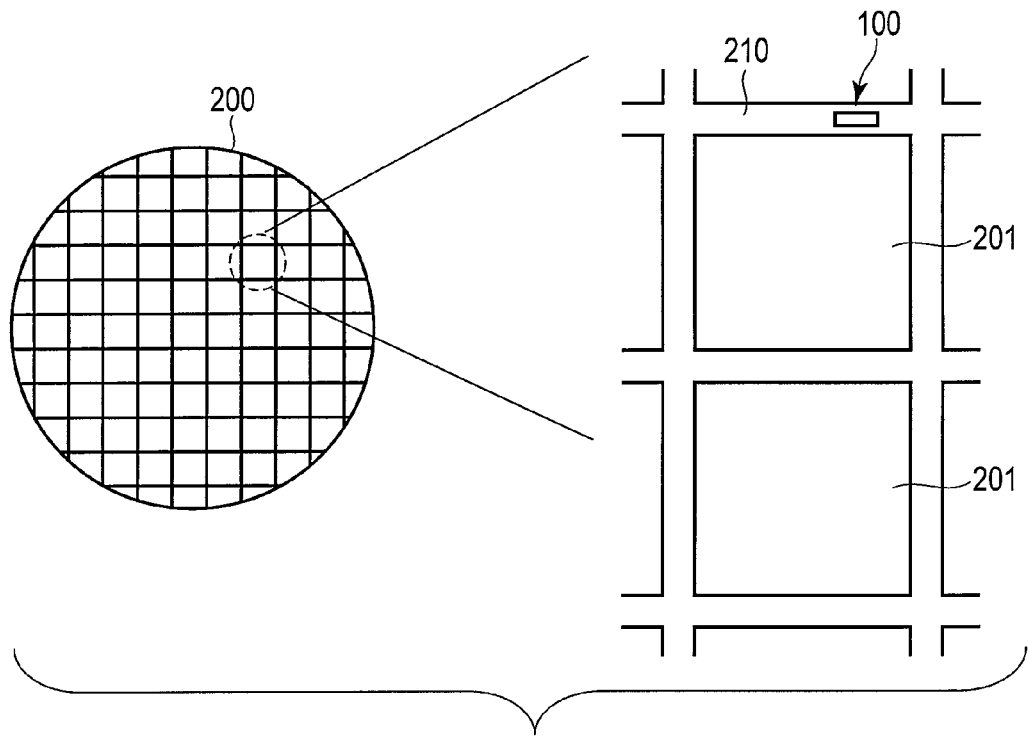
FIG. 3 is a diagram illustrating a resistor pattern according to the embodiment provided in a dicing area of a semiconductor wafer.

In the present embodiment, for example, as illustrated in FIG. 3, an evaluation pattern 100 is provided in a dicing area 210 of a semiconductor wafer 200. The semiconductor wafer may be, for example, a Si wafer, a SOI wafer, or any other semiconductor wafer other than Si.

A semiconductor wafer 200 has a main surface on which a plurality of chip areas 201 and the above-described dicing line area 210 are provided. The dicing line areas 210 are formed on the periphery the plurality of chip areas 201. Each of the plurality of chip areas 201 includes a device pattern (not illustrated). This device pattern includes a plurality of resistors (not illustrated) arranged in matrix.

Here, the number of the plurality of resistors of the device pattern is sixty four. That is, the number of resistors included in the evaluation pattern of the resistors (hereinafter referred to as "evaluation pattern") is equal to the number of the plurality of resistors of the device pattern. The layout of the plurality of resistors of the evaluation pattern 100 is the same as the layout of the plurality of resistors of the device pattern. The number of the plurality of resistors of the evaluation pattern 100 may possibly be smaller than the number of the plurality of resistors of the above-described device pattern.

The evaluation pattern 100 is provided on the dicing line area 210 on the periphery of at least one chip area of the plurality of chip areas 201. FIG. 3 illustrates an example in which the evaluation pattern 100 is provided in the dicing line area 210 on the periphery of one chip area.

Figure 4:
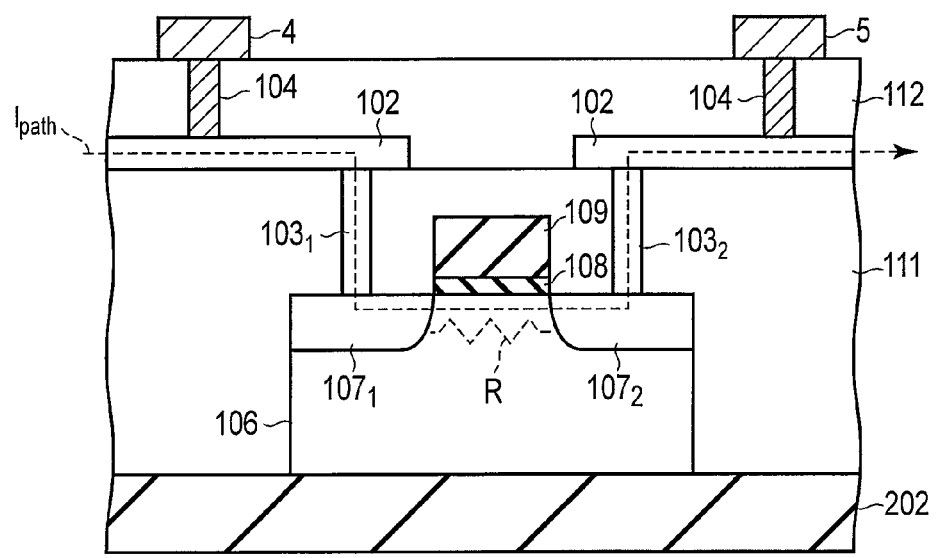
FIG. 4 is a cross sectional view of a part of the evaluation pattern of the embodiment.
Figure 5:
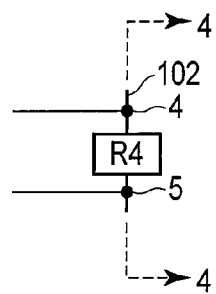
FIG. 5 is a plane view for explaining a cross sectional part of the cross section of FIG. 4.

FIG. 4 is a cross sectional view of a part of the evaluation pattern of the embodiment. This cross sectional view is taken along a broken line 4-4 of a resistor R4, as illustrated in FIG. 5. The resistor R4 is provided with pad wiring.

The resistor of the embodiment includes a polycrystalline silicon film 106 (resistor body) including impurities. The polycrystalline silicon film 106 is formed on an insulating film 202 formed in the dicing area. The insulating film 202 is an insulating film to fill a trench for STI (Shallow Trench Isolation).

A first silicide area $107_1$ is formed in a part of the surface of the polycrystalline silicon film 106. A second silicide area $107_2$ not in contact with the first silicide area $107_1$ is formed in a part of the surface of the polycrystalline silicon film 106.

A silicon oxide film 108 and a silicon nitride film 109 are formed as a silicide block, on the surface of the polycrystalline silicon film 106 between the first silicide area 1071 and the second silicide area $107_2$. The silicon nitride film 109 is thicker than the silicon oxide film 108.

In this manner, the resistor of the embodiment includes the polycrystalline silicon film 106, the silicide areas $107_1$ and $107_2$, and the silicide blocks 108 and 109.

The resistor of the embodiment is covered with a first interlayer insulating film 111. In the first interlayer insulating film 111, a contact plug $103_1$ connected to the silicide area $107_1$ is formed. Similarly, in the first interlayer insulating film 111, a contact plug $103_2$ connected to the silicide area $107_2$ is formed.

Current wiring 102 is formed on the first interlayer insulating film 111. The current wiring 102 is cut above the silicide block 109. In the illustration, the current wiring 102 on the left hand side is connected to the silicide area 1071 via the contact plug $103_1$. The current wiring 102 on the right hand side is connected to the silicide area $107_2$ via the contact plug $103_2$.

FIG. 4 illustrates a current path through which a current flows, with a broken line $I_{path}$. The current flows through the left side current wiring 102, the contact plug $103_1$, the silicide area $107_1$, the silicide area $107_2$, the contact plug $103_2$, and the right side current wiring 102.

The connection structure including the left side current wiring 102, the contact plug $103_1$, the contact plug $103_2$, and the right side current wiring 102 is formed in each of the entire resistors R01 to R64. Thus, the resistors R01 to R64 are connected in series by the above-described connection structures.

A second interlayer insulating film 112 covering the current wiring 102 is formed on the first interlayer insulating film 111. In the second interlayer insulating film 112, a contact plug 104 connected to the left side current wiring 102 (the current wiring 102 positioned above the first silicide area $107_1$) is formed. This contact plug 104 is connected to the pad wiring 4.

Similarly, in the second interlayer insulating film 112, the contact plug 104 connected to the right side current wiring 102 (the current wiring 102 positioned above the second silicide area $107_2$) is formed. This contact plug 104 is connected to the pad wiring 5.

In a state where a current flows to the current wiring 102, a voltage between the two pad wiring 4 and 5 is measured, thereby acquiring the resistance value of the resistor. As illustrated in FIG. 4 this resistance value corresponds to the resistance value R of the polycrystalline silicon film 106 between the first silicide area $107_1$ and the second silicide area.

Figure 6:
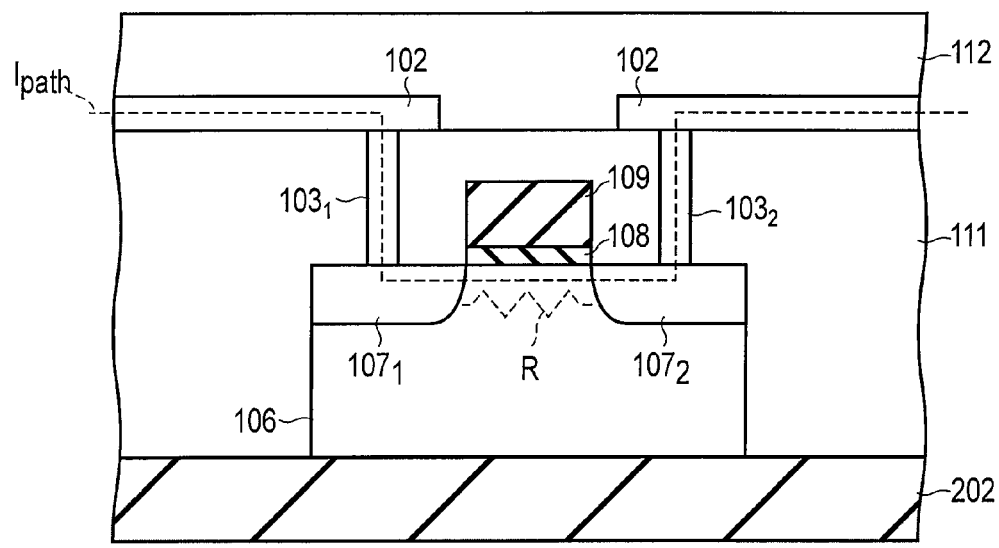
FIG. 6 is a cross sectional view of another part of the evaluation pattern of the present embodiment.
Figure 7:
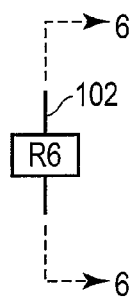
FIG. 7 is a plane view for explaining a cross sectional part of the cross section of FIG. 6.

FIG. 6 illustrates a cross sectional view of another part of the evaluation pattern of the embodiment. As illustrated in FIG. 7, FIG. 6 is a cross sectional view taken along a broken line 6-6 of the resistor R6 (resistor without the pad wiring).

Second Embodiment

Descriptions will now be made to an evaluation method using the evaluation pattern of the first embodiment.

Figure 8:
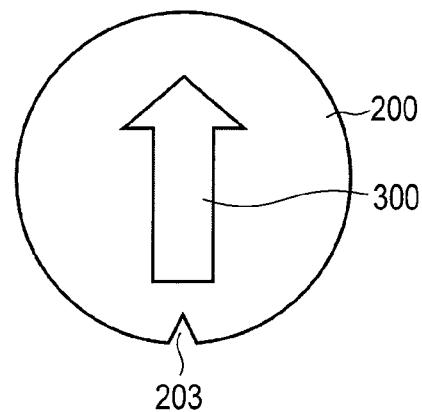
FIG. 8 is a diagram schematically illustrating a state of heating a semiconductor wafer by scanning the semiconductor wafer with laser beam from down to up.

FIG. 8 is a diagram schematically illustrating a state where the semiconductor wafer 200 is heated (LSA) by $CO_2$ laser beam 300 (LSA), by scanning (first light irradiation) the semiconductor wafer 200 with the laser beam 300. In FIG. 8, an irradiation direction of the laser beam 300 is 0 degree with reference to a notch 203 as a standard, and the laser beam 300 is scanned from down to up.

Figure 9:
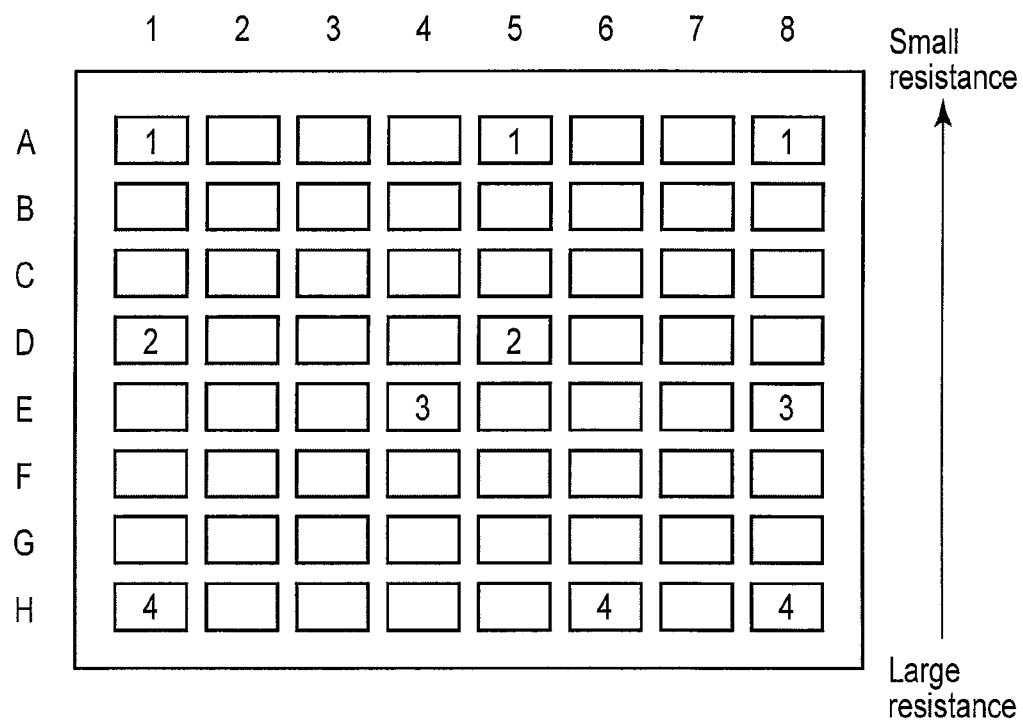
FIG. 9 is a diagram illustrating a resistance variation of the evaluation pattern provided in the heated semiconductor waver of FIG. 8.

FIG. 9 is a diagram illustrating resistance variation of the evaluation pattern provided in the semiconductor wafer 200 on which the LSA has been performed. In FIG. 9, each of the resistors R01 to R64 of FIG. 1 is distinguished by specifying a particular row (any one of A to H) and a column (any one of 1 to 8). In FIG. 9, the numeral given to the resistor shows the relative value of the resistance value, which indicates that the resistance value is larger as the numeral is larger.

As seen from FIG. 9, when the scan direction of the laser beam is from down to up, the resistance distribution occurs, and the resistance variation is large. In the resistance distribution, the resistance variation becomes low toward the scan direction.

Figure 10:
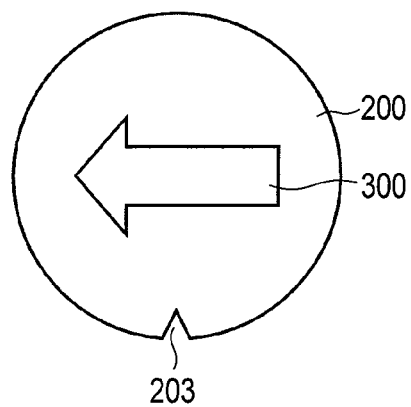
FIG. 10 is a diagram schematically illustrating a state of heating a semiconductor wafer by scanning the semiconductor wafer with laser beam from right to left.

FIG. 10 is a diagram schematically illustrating another state where the semiconductor wafer 200 is heated (LSA) by the $CO_2$ laser beam 300, by scanning (first light irradiation) the semiconductor wafer 200 with the $CO_2$ laser beam 300. In FIG. 10, the irradiation direction of the laser beam 300 is ninety degrees with reference to the notch 203 as a standard, and the laser beam 300 is scanned from right to left.

Figure 11:
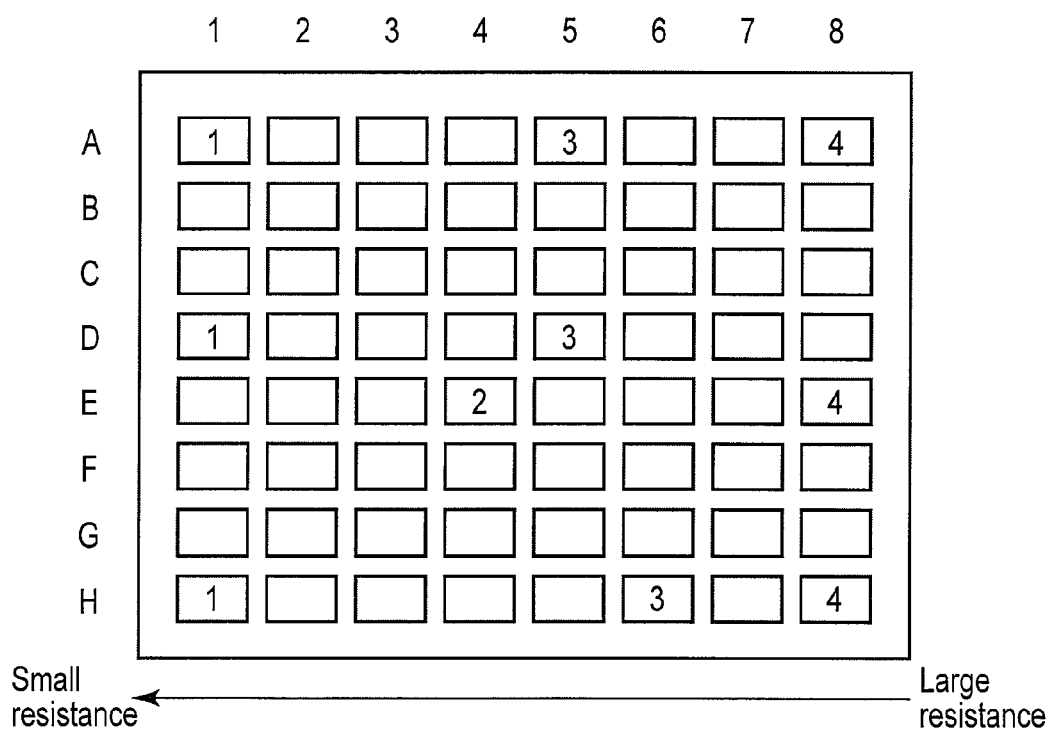
FIG. 11 is a diagram illustrating a resistance variation of the evaluation pattern provided in the heated semiconductor wafer of FIG. 10.

FIG. 11 is a diagram illustrating the resistance variation of the evaluation pattern provided in the semiconductor wafer 200 on which the LSA of FIG. 10 has been performed.

As seen from FIG. 11, when the scan direction of the laser beam 300 is from right to left, the resistance distribution occurs, and furthermore the resistance variation is large. In the resistance distribution, the resistance values become low toward the scan direction.

FIG. 12 is a diagram schematically illustrating still another state where the semiconductor wafer 200 is heated (LSA) by the $CO_2$ laser beam 300, by scanning (first light irradiation) the semiconductor wafer 200 with the $CO_2$ laser beam 300. In FIG. 12, the irradiation direction of the laser beam 300 is 135 degrees with reference to the notch 203 as a standard, and the laser beam 300 is scanned diagonally from upper right to lower left.

FIG. 13 is a diagram illustrating a resistance variation of the evaluation pattern provided in the semiconductor wafer 200 on which the LSA has been performed, as illustrated in FIG. 12.

As seen from FIG. 13, when the scan direction of the laser beam 300 is diagonal, it is seen that the resistance variation is small.

According to the inventor's assiduous study, as described above, it is obvious that the resistance distribution of the plurality of resistors changes in accordance with the scan direction of the laser beam. Though the reasons are not unknown, one of the reasons may be considered as below.

In FIG. 9, a resistor (A, 1) is arranged in the uppermost row together with resistors (A, 5) to (A, 8). No resistor exists ahead of the resistors (A, 1) to (A, 8), however an isolation insulating film (not shown) exists.

Different materials are used between the resistors (polycrystalline silicon film) and the isolation insulating film (for example, silicon oxide film). In general, the isolation insulating film has lower thermal conductivity than that of the resistors.

Thus, as illustrated in FIG. 8, if the laser beam 300 is scanned from down to up, heat is likely to remained near the boundary between the resistors (A, 1) to (A, 8) and the isolation insulating film, resulting in the temperature distribution in which the temperature increases from the row H to the row A. As a result, as illustrated in FIG. 9, it is considered that the resistance distribution occurs. In this resistance distribution, the resistance value decreases from the row H to the row A (scan direction).

In the present embodiment, as illustrated in FIG. 14, to decrease the resistance variation illustrated in FIG. 9, the laser beam 300 is scanned from up to down of the semiconductor wafer 200 (second light irradiation). That is, the laser beam 300 is scanned in a direction opposite to that of FIG. 8. Unlike FIG. 8, there occurs the resistance distribution in which the resistance value decreases from the row A to the row H (scan direction). That is, if the second light irradiation is performed, it is considered that there occurs the resistance distribution for compensating the resistance distribution which occurred due to the first light irradiation. In fact, it is confirmed that the resistance variation is small, as a result of examination on the resistance distribution after the second light irradiation.

Let it be assumed that the conventional light irradiation power (power of the laser beam 300 at the above-described first light irradiation, when only the first light irradiation is performed and the second laser beam is not performed) is referred to as P0, the first light irradiation power of the embodiment is referred to as P1, and the second light irradiation power of the embodiment is P2. In this case, P1 and P2 are set to satisfy P0=P1+P2. For example, P1=P2=P0/2. In this manner, if P1 and P2 are set, the semiconductor wafer is restrained from being heated beyond necessity.

In the present embodiment, it is not essential that P0=P1+P2. It is possible that P0>P1+P2. On the contrary, it is possible that P0<P1+P2. It is not essential that P1=P2. It is possible that P1>P2, or P1<P2.

Similarly, in the present embodiment, as illustrated in FIG. 15, to decrease the resistance variation illustrated in FIG. 10, the laser beam 300 is scanned (second light irradiation) from left to right of the semiconductor wafer 200, in a direction opposite to that of FIG. 10. If the second light irradiation is performed, there occurs the resistance distribution in which the resistance value decreases from the column 1 to the column 8 (scan direction), in a direction opposite to FIG. 10. That is, there occurs the resistance distribution for compensating the resistance distribution occurred due to the first light irradiation, thus decreasing the resistance variation.

In the case of the radiation (first light irradiation) of the laser beam 300 in the direction illustrated in FIG. 12, as illustrated in FIG. 13, because the resistance variation is small, the second light irradiation is not performed.

Descriptions will now be made to a manufacturing method for the semiconductor device of the embodiment, in consideration of the above-descried matter.

Figure 16:
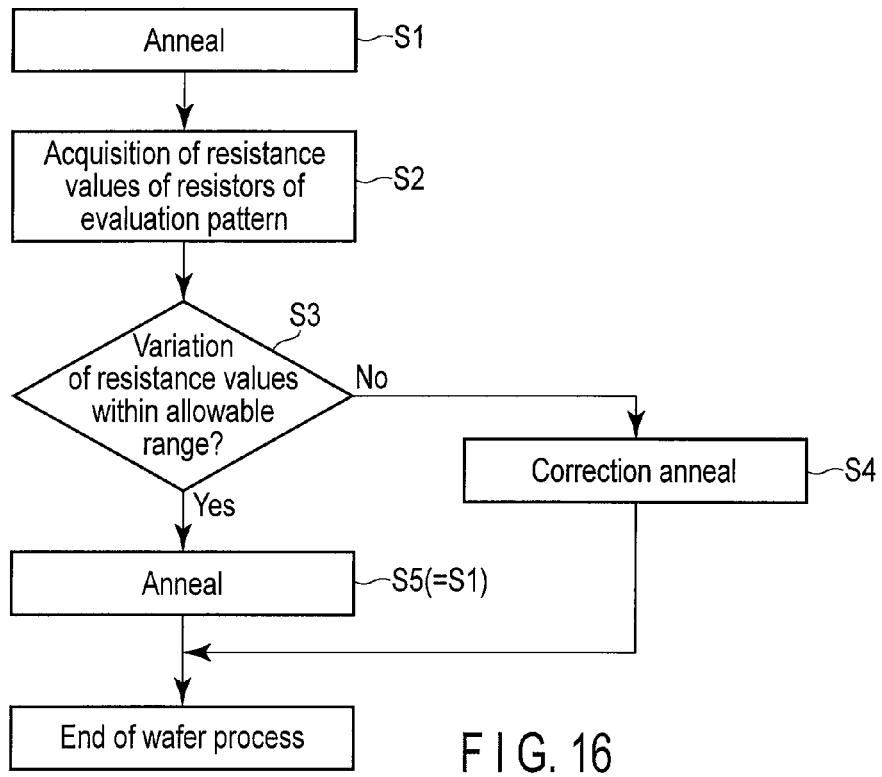
FIG. 16 is a flowchart illustrating a manufacturing method of a semiconductor device according to a second embodiment.

FIG. 16 is a flowchart illustrating a manufacturing method for the semiconductor device of the present embodiment.

First, anneal (for example, LSA) is performed for the evaluation pattern in the dicing area of the semiconductor wafer (Step S1). The anneal is not limited to the LSA. The processing method of the present embodiment is applicable to the anneal using the scanning, other than the LSA.

Next, resistance values of some (N number) of resistors of the plurality (M number) of resistors in the evaluation pattern are acquired (Step S2). Now, M≥N, N≥2.

Next, a determination is made as to whether the acquired resistance variation of the resistors is within the allowable range (Step S3). This determination is made, for example, based on a difference between the largest resistance value Rmax and the lowest resistance value Rmin (Rmax−Rmin). In this case, if the difference (Rmax−Rmin) is larger than a constant value (threshold value), it is determined as NO. This determination may be made based on the variance of the resistance values.

If the determination of Step S3 is YES, the same anneal Step S5 as that of Step S1 is performed for the device pattern in the chip area of the semiconductor wafer. For example, when the LSA is performed as the anneal of Step S1, the LSA is performed on the same condition, that is, in the same scan direction and with the same light energy.

The above-described device pattern includes a plurality of resistors corresponding to the plurality of resistors of the evaluation pattern, for example, the plurality of resistors in an analog/digital converter circuit.

If the determination of Step S3 is NO, to decrease the resistance variation, a correction anneal is performed for the above-described device pattern (Step S4). The correction anneal of Step S4 is performed in a scan direction opposite to that of the anneal of Step S1. It will be readily understood by the skilled in the art, from the explanations with reference to FIG. 8 to FIG. 15, that the resistance variation can be small by performing such the correction annealing.

When the manufacturing method for the semiconductor device of the present embodiment is applied to a plurality of semiconductor wafers, the plurality of semiconductor wafers go through the same steps.

Figure 17:
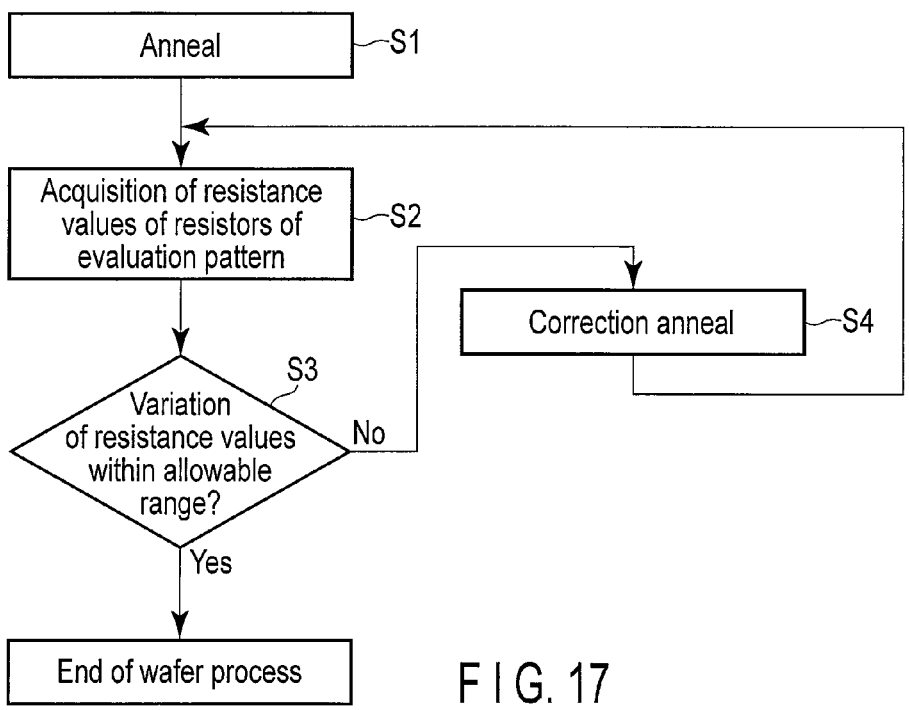
FIG. 17 is a flowchart illustrating a manufacturing method of the semiconductor device according to the second embodiment.

FIG. 17 is a flowchart illustrating another manufacturing method for the semiconductor device of the present embodiment.

The manufacturing method of the semiconductor device of FIG. 17 differs from that of the semiconductor device of FIG. 16 as follow. That is after Step S4 (correction anneal), the flow returns to Step S2, then the procedures repeats from Step S2 to S4, until the resistance variation remains within the allowable range. In this case, because it is confirmed whether there is an effect of the correction anneal, the resistance variation can more effectively be restrained. Even if the loop from Step S2 to S4 repeats for a predetermined number of times, the process may end, if the determination result of Step S3 is not YES.

FIG. 18 is a flowchart illustrating another manufacturing method for the semiconductor device of embodiment.

In the case of the manufacturing method for the semiconductor device as illustrated in FIG. 16 and FIG. 17, the same steps are performed for a plurality of semiconductor devices. In the case of the manufacturing method for the semiconductor device as illustrated FIG. 18, different steps are performed for the first semiconductor wafer and the second semiconductor wafer.

In the process for the first semiconductor wafer, if the determination of Step S3 is NO, Step S1 to Step S4 are performed, like the processing method of FIG. 16 or FIG. 17.

When the determination of Step S3 for the first semiconductor wafer is NO, it is assumed that there is a high possibility that the determination of Step S3 is NO as well for the second semiconductor wafer or later.

Therefore, in the present embodiment, when the determination of Step S3 is NO in the process for the first semiconductor wafer, the anneal of Step S5 (=S1) and the correction anneal of Step S6 (=S4) are performed for the second semiconductor wafer or later. In this case, Step S2 and Step S3 are not included.

When the determination of Step S3 for the first semiconductor wafer is YES, it is assumed that there is a high possibility that the determination is YES also for the second semiconductor wafer or later.

Therefore, in the present embodiment, when the determination of Step S3 is YES in the process for the first semiconductor wafer, the anneal of Step S7 (=S1) is performed for the second semiconductor wafer or later. In this case, Step S2 and Step S3 are not included.

Figure 19:
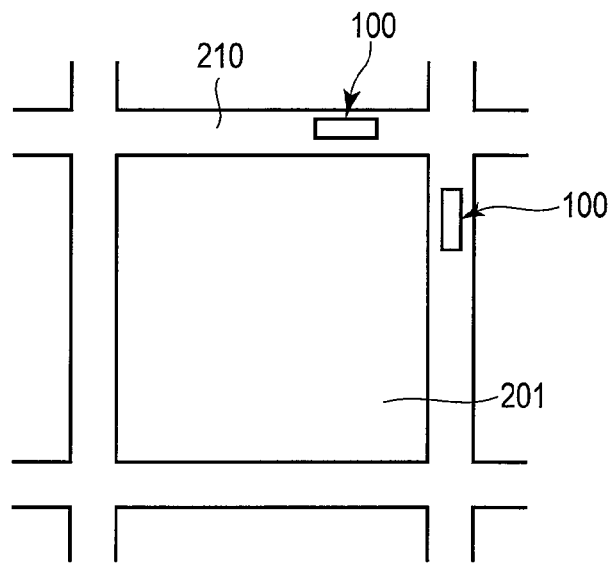
FIG. 19 is a diagram schematically illustrating the evaluation pattern of another embodiment provided in a dicing area of a semiconductor wafer.

In the first and second embodiments, as illustrated in FIG. 3, the number of the evaluation pattern 100 provided in the dicing area 210 is only one. However, as illustrated in FIG. 19, two evaluation patterns 100 may be provided. In FIG. 19, the two evaluation patterns 100 are arranged to form different longitudinal directions of the resistor patterns 101 of the two evaluation patterns 100. Three or more evaluation patterns may be provided.

Third Embodiment

Figure 20:
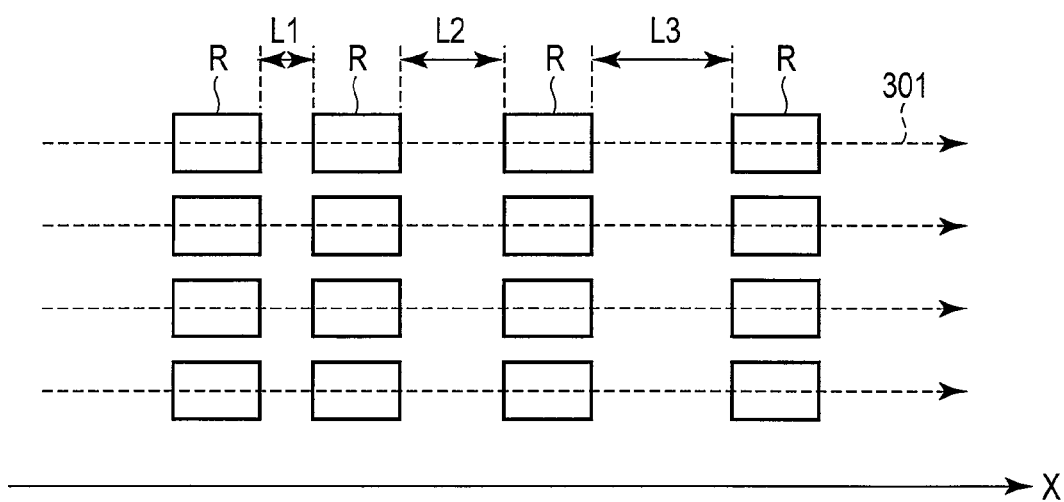
FIG. 20 is a plane view schematically illustrating an evaluation pattern according to a third embodiment.

FIG. 20 is a plane view schematically illustrating an evaluation pattern according to the third embodiment.

In the present embodiment, what differs from the first embodiment is that a plurality of resistors in the same row (four resistors R in FIG. 20) are arranged at different distances (L1, L2, and L3 in FIG. 20) (L1<L2<L3) along the column direction (X direction). A member which exists between the resistors R is an isolation insulating film (STI). In the present embodiment, the ratio of dimension in the X-direction of the resistor R to the dimension in the X-direction of the isolation area (coverage ratio) decreases from left to right.

According to the present embodiment, as illustrated in FIG. 20, if a plurality of resistors R in the same row are irradiated with laser beam 301 (for example, $CO_2$ laser beam), the resistance values of the resistors R with different coverage ratios can be acquired. This allows obtaining a coverage ratio for realizing a small resistance variation, without using a plurality of semiconductor wafers for evaluations in which evaluation patterns with different coverage ratios are formed. In addition, it is possible to restrain an increase in the cost, because only one semiconductor wafer for evaluation is necessary.

Fourth Embodiment

Figure 21:
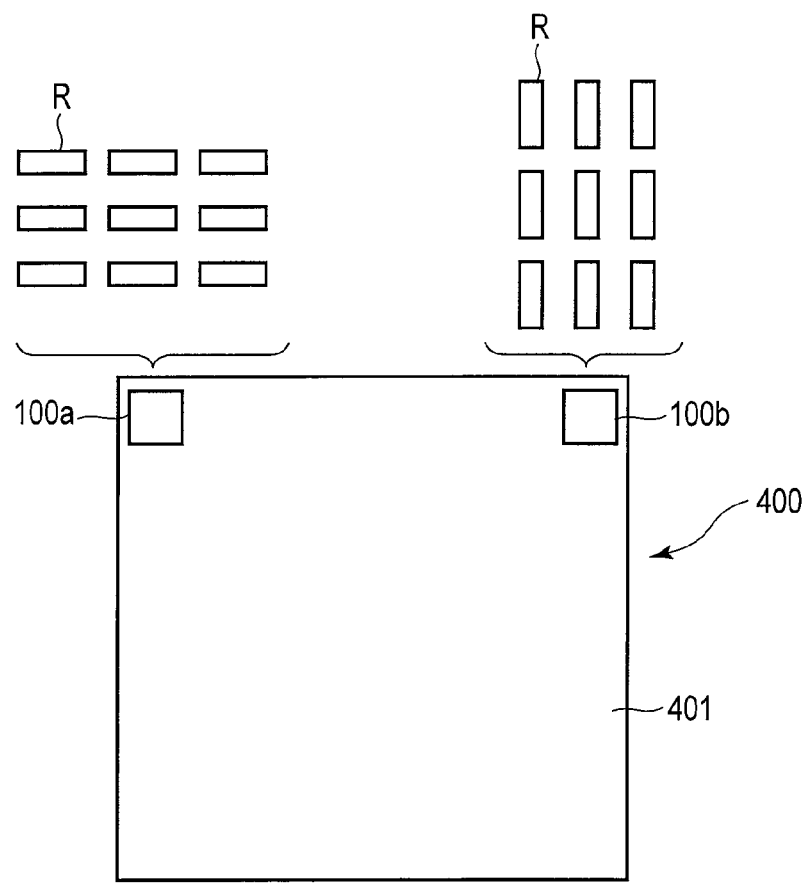
FIG. 21 is a plane view schematically illustrating a semiconductor device according to a fourth embodiment.

FIG. 21 is a plane view schematically illustrating a semiconductor wafer according to the fourth embodiment.

In the illustration, a semiconductor device 400 according to the present embodiment includes a substrate 401, such as a semiconductor substrate. A circuit (not shown) is formed on the substrate 401. This circuit is, for example, an analog/digital converter circuit. Two evaluation patterns 100a and 100b are formed in a free space of the substrate 401.

In FIG. 21, the evaluation pattern 100a is arranged at the upper left of the substrate 401, while the evaluation pattern 100b is arranged at the upper right of the substrate 401. However, the arrangement positions of the evaluation patterns 100a and 100b may appropriately be changed.

In the present embodiment, the plurality of resistors R (resistor pattern) constituting the evaluation pattern 100a are not for evaluating the resistance variation of the resistor pattern in the circuit formed on the substrate 401.

The evaluation pattern 100a is for evaluating the resistance variation of the resistor pattern (new resistor pattern) corresponding to the next version of the resistor pattern (present resistor pattern) in the circuit. In this case, the new resistor pattern is used in a semiconductor device similar to the semiconductor device 400. Thus, evaluating the evaluation pattern 100a in the semiconductor device 400 is about the same as evaluating the new evaluation pattern in the same environment as the environment in which the new resistor pattern is used in fact. This allows immediately evaluating the resistance variation of the new resistor pattern.

This applies also to the evaluation pattern 100b. The evaluation pattern 100b is used for evaluating the resistor pattern different from the evaluation pattern 100a. FIG. 21 illustrates an example of evaluating the resistor patterns in different directions. However, the patterns may have another different element, such as their form or the size.

According to the present embodiment, it is possible to evaluate the distribution of the resistance variation of a resistor pattern other than the resistor pattern in the circuit constituting the semiconductor device 400, by using the evaluation patterns 100a and 100b provided on the substrate 401.

In FIG. 21, two evaluation patterns 100a and 100b are formed. However, three or more evaluation patterns may be formed, or only one evaluation pattern may be formed, instead.

Fifth Embodiment

Figure 22:
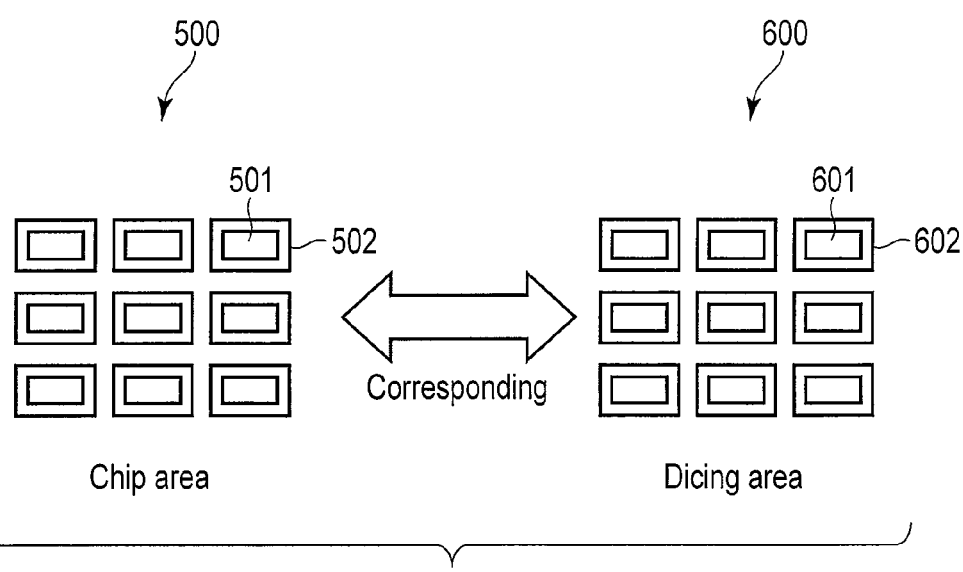
FIG. 22 is a plane view for explaining an evaluation pattern according to a fifth embodiment.

FIG. 22 is a plane view for explaining an evaluation pattern according to a fifth embodiment.

A resistor pattern 500 is formed in a chip area of the semiconductor wafer. The resistor pattern 500 includes a plurality of resistors 501. FIG. 22 illustrates an example of the resistor pattern 500 including resistors 501 (three rows by three columns). The resistors 501 are formed on isolation areas 502. The isolation area 502 is defined by, for example, an insulating film in the trench for the STI. Areas between the isolation areas 502 are active areas.

In the present embodiment, an evaluation pattern 600 corresponding to the resistor pattern 500 is formed in the dicing area of the semiconductor wafer to evaluate the resistor pattern 500 (the resistor pattern including a plurality of resistors formed on a plurality of isolation areas). That is, a plurality of element isolation areas 602 are formed in the dicing area, and resistors 601 are formed respectively on the isolation areas 602.

According to the present embodiment, resistance variation of the pattern, which comprises the plurality of resistors 501 formed on the plurality of isolation areas 502 in the chip area, can be evaluated by using the evaluation pattern 600 in the dicing area.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device in a semiconductor wafer, the semiconductor device comprising a resistor pattern including a plurality of resistors provided in the semiconductor wafer and arranged in matrix of at least two rows and at least two columns, and a connection structure configured to connect the plurality of resistors in series, wherein the plurality of resistors includes a plurality of first resistors provided in a chip of the semiconductor wafer and a plurality of second resistors provided in a dicing area of the semiconductor wafer, the method comprising:

heating the resistor pattern by scanning the plurality of resistors with a first beam under a first beam scanning condition, acquiring resistance values of the plurality of second resistors; and determining whether variation of the resistance values of the plurality of first resistors is within an allowable range, based on the acquired resistance values of the plurality of second resistors.

2. The method according to claim 1, further comprising:

further heating the plurality of first resistors, by scanning the plurality of first resistors with the first beam under the first beam scanning condition, when the variation of the resistance values of the plurality of second resistors is within the allowable range.

3. The method according to claim 1, further comprising:

obtaining a second beam scanning condition based on the acquired resistance values of the plurality of resistors, to decrease the variation of the resistance values of the plurality of resistors, by scanning the plurality of resistors with the second beam under the second beam scanning condition, when the variation of the resistance values of the plurality of second resistors is not within the allowable range.

4. The method according to claim 3, wherein the variation of the plurality of resistors is decreased within the allowable range.

5. The method according to claim 3, wherein the second beam scanning condition is at least one of a scan direction of the second beam and a light irradiation power of the second beam.

6. The method according to claim 1, further comprising:

scanning the plurality of first resistors with a second beam under a second beam scanning condition, when the variation of the resistance values of the plurality of second resistors is not within the allowable range.

7. The method according to claim 6, wherein a scan direction of the first beam and a scan direction of the second beam are different from each other by approximately 180 degrees.

8. The method according to claim 7, wherein a light irradiation power of the first beam and a light irradiation power of the second beam are approximately equal.

9. The method according to claim 1, further comprising:

repeating to scan with a beam under a beam scanning condition different from the first beam scanning condition in order to decrease the variation of the resistance values within the allowable range.

10. The method according to claim 1, wherein the heating the plurality of first resistors is performed by using a millisecond anneal.

11. The method according to claim 10, wherein the millisecond anneal is a laser spike anneal.

* * * * *